United States Patent
Wabuka

Patent Number: 5,216,300
Date of Patent: Jun. 1, 1993

[54] OUTPUT BUFFER FOR SEMICONDUCTOR INTEGRATED CIRCUIT

[75] Inventor: Hiroshi Wabuka, Tokyo, Japan
[73] Assignee: NEC Corporation, Tokyo, Japan
[21] Appl. No.: 777,069
[22] Filed: Oct. 16, 1991

[30] Foreign Application Priority Data

Oct. 17, 1990 [JP] Japan .................. 2-278267

[51] Int. Cl.⁵ .................. H03K 19/092; H03K 19/094
[52] U.S. Cl. ........................ 307/475; 307/451
[58] Field of Search ............ 307/475, 451, 456, 270, 307/443

[56] References Cited

U.S. PATENT DOCUMENTS

| | | | |
|---|---|---|---|
| 4,785,201 | 11/1988 | Martinez | 307/451 |
| 4,785,203 | 11/1988 | Nakamura | 307/451 |
| 4,825,101 | 4/1989 | Walters, Jr. | 307/451 |
| 4,829,199 | 5/1989 | Prater | 307/451 |
| 4,855,623 | 8/1989 | Flaherty | 307/475 |
| 4,961,010 | 10/1990 | Davis | 307/451 |
| 5,003,205 | 3/1991 | Kohda et al. | 307/475 |
| 5,008,568 | 4/1991 | Leung et al. | 307/475 |
| 5,089,722 | 2/1992 | Amedeo | 307/475 |

*Primary Examiner*—Edward P. Westin
*Assistant Examiner*—Richard Roseen

[57] ABSTRACT

An output buffer of a semiconductor integrated circuit, including a P channel MOS transistor connected between first power source and an output terminal and a first N channel MOS transistor connected between a second power source and the output terminal, the first P and N channel MOS transistors being complementarily brought into a conductive state depending upon the level of an input signal given to the gates thereof for driving an output load including a signal transmission line connected with the output terminal is characterized in that each of said P and N channel MOS transistors has an output resistance equal to the characteristic impedance of the signal transmission line and in that said output buffer further includes an auxiliary control unit comprising a second N channel MOS transistor having an output resistance equal to the characteristic impedance of the signal transmission line connected in parallel with said first N channel MOS transistor between the second power source and the output terminal, and a pulse generating circuit and a drive circuit for determining the conduction period of time of the second N channel MOS transistor, which is connected with the gate of the second N channel MOS transistor.

7 Claims, 4 Drawing Sheets

FIG. 5a
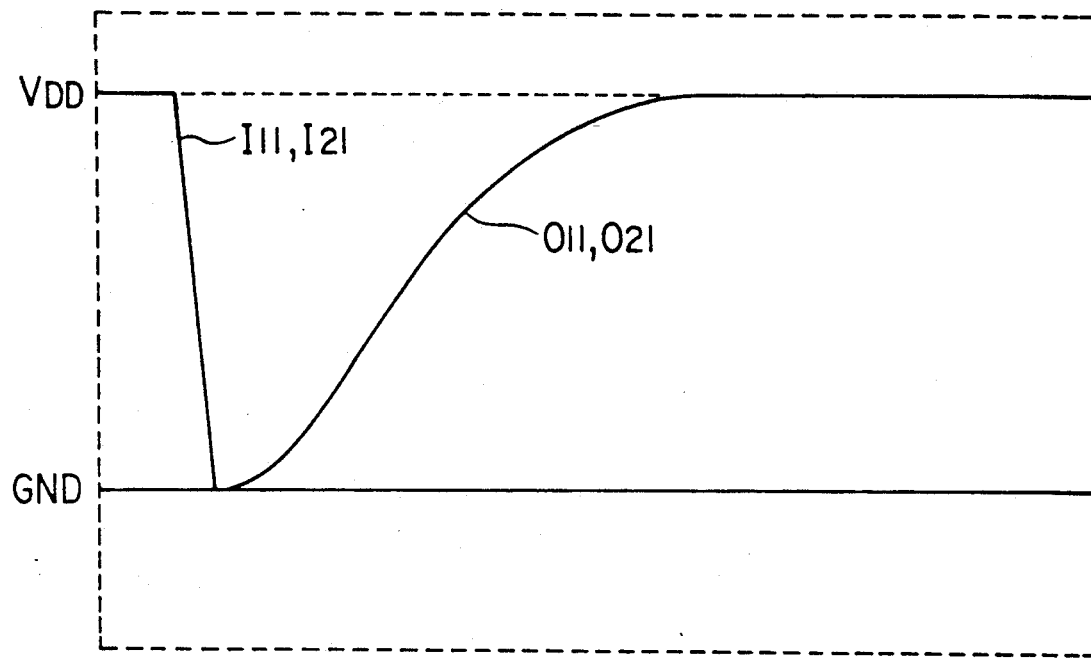
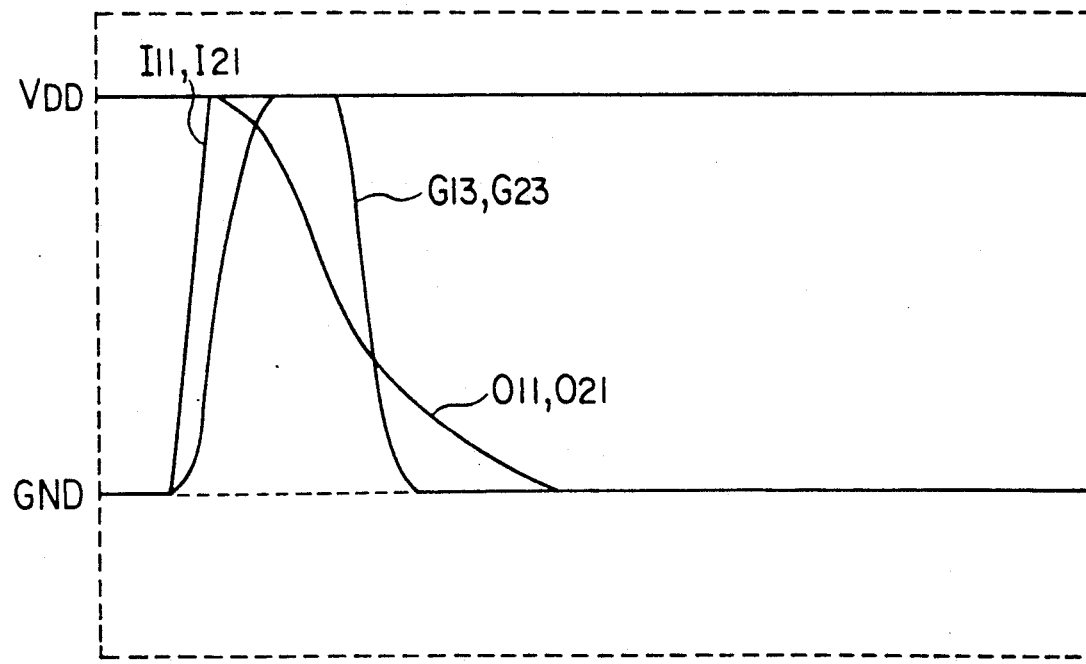
FIG. 5b

OUTPUT BUFFER FOR SEMICONDUCTOR INTEGRATED CIRCUIT

BACKGROUND OF THE INVENTION

1. Field of the Invention

The present invention relates to an output buffer and in particular to an output buffer for a semiconductor integrated circuit having a TTL interface.

2. Disclosure of the Prior

Referring now to FIG. 1, there is shown a circuit diagram showing a prior art output buffer.

In FIG. 1, an inductance L and a capacitance C which are connected with an output terminal O42 of an output buffer equivalently denote a signal transmission line having a characteristic impedance $Z_0$ matched with that of the line. The output buffer complimentarily switches P and N channel MOS transistors P42 and N41 which are respectively connected between a first power source (hereinafter referred to as $V_{DD}$) and the output terminal O42 via a drive circuit G41 comprising inverters 40 and 41 and between a second power source (hereinafter referred to as GND) and the output terminal O42 via a drive circuit G42 comprising inverters 42 and 43 in response to an input signal I41 for driving the load via the signal transmission line having the characteristic impedance $Z_0$. In the output buffer for an integrated circuit having a TTL interface of a power source voltage which is 5 volts, the geometrical dimensions of P and N channel MOS transistors at the final stage and MOS transistors which form the drive circuits G41 and G42 are determined so that a delay time since the input signal I41 falls until the level on the output point O41 reaches 2 volts from the GND level and a delay times since the input signal I41 rises until the level on the output point reaches 0.8 volts from $V_{DD}$ meet the specifications.

Referring now to FIG. 2, there is shown a circuit diagram showing a prior art output buffer used for bidirectional input/output circuits such as data bus. The difference between the output buffers of FIGS. 1 and 2 resides in that the latter output buffer is capable of switching the P and N channel MOS transistors P51 and N51 between a drive state in which either one of the transistors is conductive and a high impedance state in which both transistors are non-conductive. The difference in circuit structure resides in that NOR gate 51 and NAND gate 53 are used in drive circuits G51 and G52, respectively and the state of the output point O52 is switched by these gates.

As mentioned above, it is necessary to change the voltage on the output point of the output buffer of the integrated circuit with a TTL interface having a power source of 5 voltages from 0.0 volt to 2.0 volts at rise time and from 5.0 volts to 0.8 volts at fall time, the change in the voltage of which is about double of that of the rise time.

Speed up of the output buffer has been demanded in accordance with the speed up of the system using integrated circuits. Accordingly, it is necessary to provide the same delay times at rise and fall times on the output point. Therefore, the output resistance of an N channel MOS transistor at the final stage of the output buffer should be a half of that of a P channel MOS transistor at the final stage. As shown at O41-1 and O51-1 in FIG. 3b, if the output resistance of the N channel MOS transistor at the final stage of the output buffer is the same as that of the P channel MOS transistor, that is, the characteristic impedance of the signal transmission line, no undershoot would occur while the delay time at rise time would be extended. As shown at O41-2 and O51-2 in FIG. 3b, if the output resistance of the N channel MOS transistor at the final stage of the output buffer is lower than a half of that of the P channel MOS transistor, that is, the characteristic impedance of the signal transmission line, an undershoot and a malfunction due to this undershoot would occur.

SUMMARY OF THE INVENTION

It is an object of the present invention to provide an output buffer which overcomes the above mentioned problems.

The above object is accomplished by providing an output buffer of a semiconductor integrated circuit, including a first channel MOS transistor connected between a first power source and an output terminal and a second channel MOS transistor connected between a second power source and the output terminal of the first and second channel MOS transistors being complementarily brought into a conductive state depending upon the level of an input signal given to the gates thereof for driving an output load including a signal transmission line connected with the output terminal, characterized in that each of said first and second channel MOS transistors has an output resistance equal to the characteristic impedance of the signal transmission line and in that said output buffer further includes an auxiliary control unit comprising a third channel MOS transistor having an output resistance equal to the characteristic impedance of the signal transmission line connected in parallel with said second channel MOS transistor between the second power source and the output terminal, said first and third channel MOS transistors being complementary, and a means for bringing said second channel MOS transistor and said third channel MOS transistor into a conductive state only when the input signal rises.

BRIEF DESCRIPTION OF THE DRAWINGS

FIG. 5a is a wave form diagram for explaining the operation of the output buffer of the present invention when the potential of an output rises;

FIG. 5b is a wave form diagram for explaining the operation of the present invention when the potential of the output falls.

DETAILED DESCRIPTION OF THE PREFERRED EMBODIMENTS

Embodiments of the present invention will now be described with reference to drawings.

Figure 1:
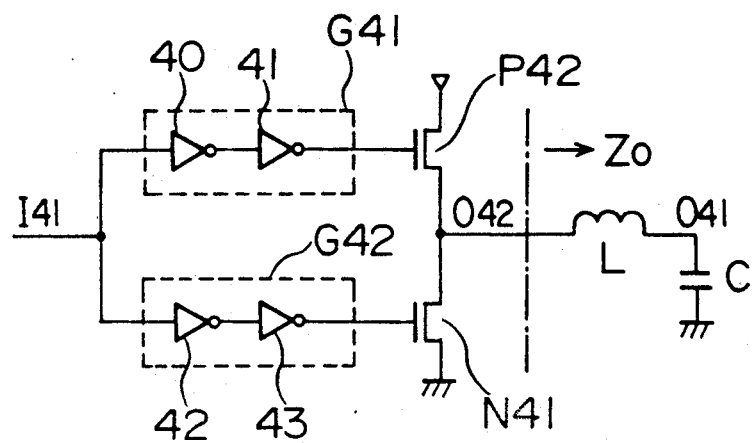
FIG. 1 is a circuit diagram showing a prior art output buffer.
Figure 2:
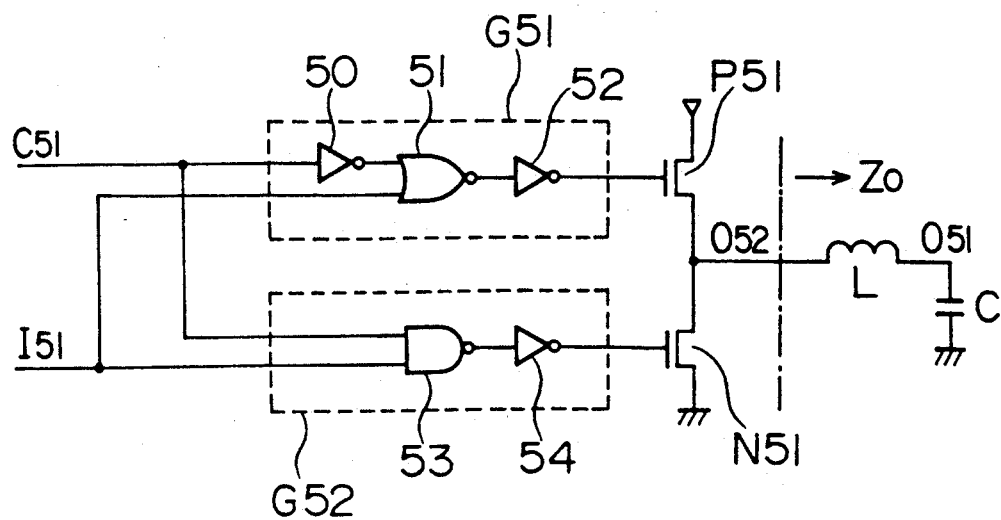
FIG. 2 is a circuit diagram showing an output buffer for a prior art bidirectional input/output circuit.
Figure 3A:
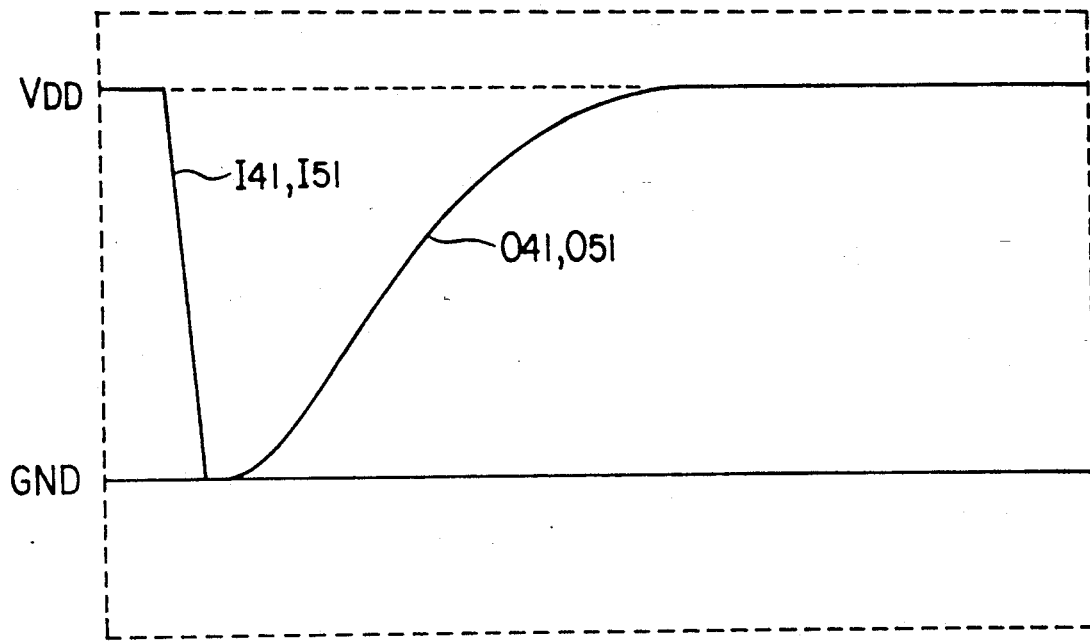
FIGS. 3a and 3b are waveform views for explaining the operation of a prior art output buffer.
Figure 3B:
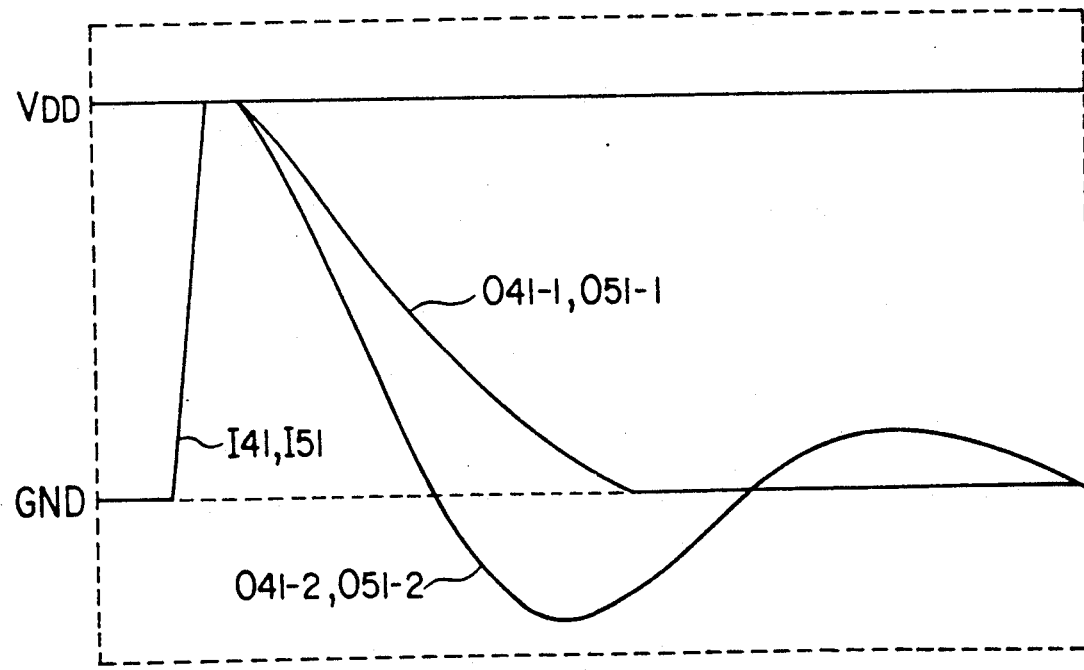
Figure 4:
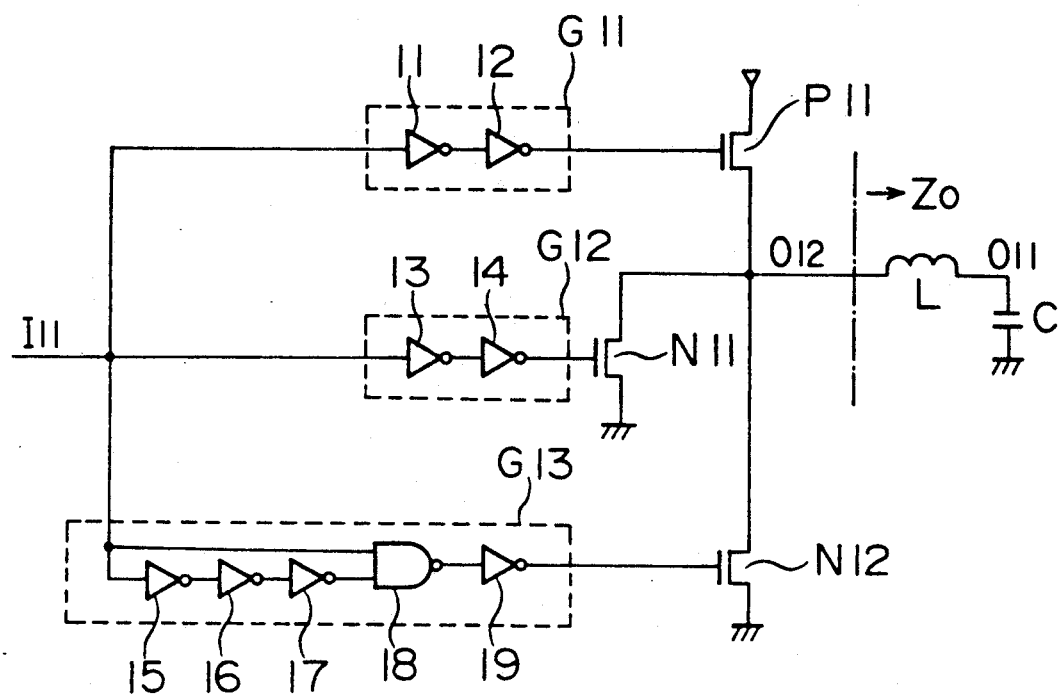
FIG. 4 is a circuit diagram showing a first embodiment of an output buffer of the present invention.

Referring now to FIG. 4, there is shown a circuit diagram showing a first embodiment of an output buffer of the present invention.

In FIG. 4, an inductance L and a capacitance C equivalently represent a signal transmission line having a characteristic impedance $Z_0$.

P and N channel MOS transistors P11 and N11 which form a first output circuit are connected in series between a power source $V_{DD}$ and a ground GND. The MOS transistors P11 and N11, each has an output resistance which is equal to the characteristic impedance $Z_0$ of the signal transmission line. The commonly connected drains of the transistors are connected with the signal transmission line. An input signal I11 is applied to the gates of the MOS transistors P11 and N11 via a drive circuit G11 comprising series-connected inverters 11 and 12 and a drive circuit G12 comprising series-connected inverters 13 and 14, respectively.

On the other hand, an N channel MOSs transistor N12 which forms a second output circuit is connected in parallel with the N channel MOS transistor N11 between the output terminal O12 and the ground GND. The output resistance of the N channel MOS transistor N12 is preset equal to that of the N channel MOS transistor N11.

An output of an auxiliary drive circuit G13 which brings the N channel MOS transistor N12 into a conductive state only when the input signal I11 rises is applied to the gate of the N channel MOS transistor N12. The auxiliary drive circuit G13 comprises a circuit of series-connected inverters 15, 16 and 17 for inverting the input signal I11 and a NAND gate 18 to which the output of the inverter circuit and the input signal I11 are applied, and an inverter 19 for inverting the output of the gate 18.

FIGS. 5a and 5b are wave form diagrams illustrating the operation of the output buffer. When the input signal I11 changes from a $V_{DD}$ level to a GND level, the gate potentials of the MOS transistors P11 and N11 are changed to the GND level through the drive circuits G11 and G12. Accordingly, the P and N channel MOS transistors P11 and N11 are turned on and off, respectively. The signal transmission line is charged by the P channel MOS transistor P11 so that the output signal rises. However, no overshoot will occur on the output terminal O12 since the impedance of the output resistance of the P channel MOS transistor P11 is matched with that of the signal transmission line.

On the other hand, when the input signal I11 changes from the GND level to the $V_{DD}$ level, the gate potentials of the MOS transistors P11 and N11 are changed to the $V_{DD}$ level through the drive circuits G11 and G12. Accordingly, the P and N channel MOS transistors P11 and N11 are turned off and on, respectively. Since the gate potential of the N channel MOS transistor N11 is changed to $V_{DD}$ level through the drive circuit G12, and at the same time, the gate potential of the N channel MOS transistor N12 is changed to the $V_{DD}$ level via the auxiliary drive circuit G13, the N channel MOS transistor N12 is turned on. This causes the signal transmission line to be quickly discharged by the N channel MOS transistors N11 and N12 so that the output signal falls.

In the auxiliary drive circuit G13, after only a signal transmission delay time due to the inverters 15 to 17 passes since the input signal I11 rises, the output of the inverter 17 falls and the output of the NAND gate is inverted to the $V_{DD}$ level. The output of the inverter 19 is inverted to the GND level and the N channel MOS transistor N12 is turned off.

If the input signal falls in such a manner, both of the N channel MOS transistors N11 and N12 are turned on in the transient condition. The N channel MOS transistor N12 is then turned off. Accordingly, the fall delay time is equal to the rise delay time so that an undershoot of the output signal O11 can be reduced.

Figure 6:
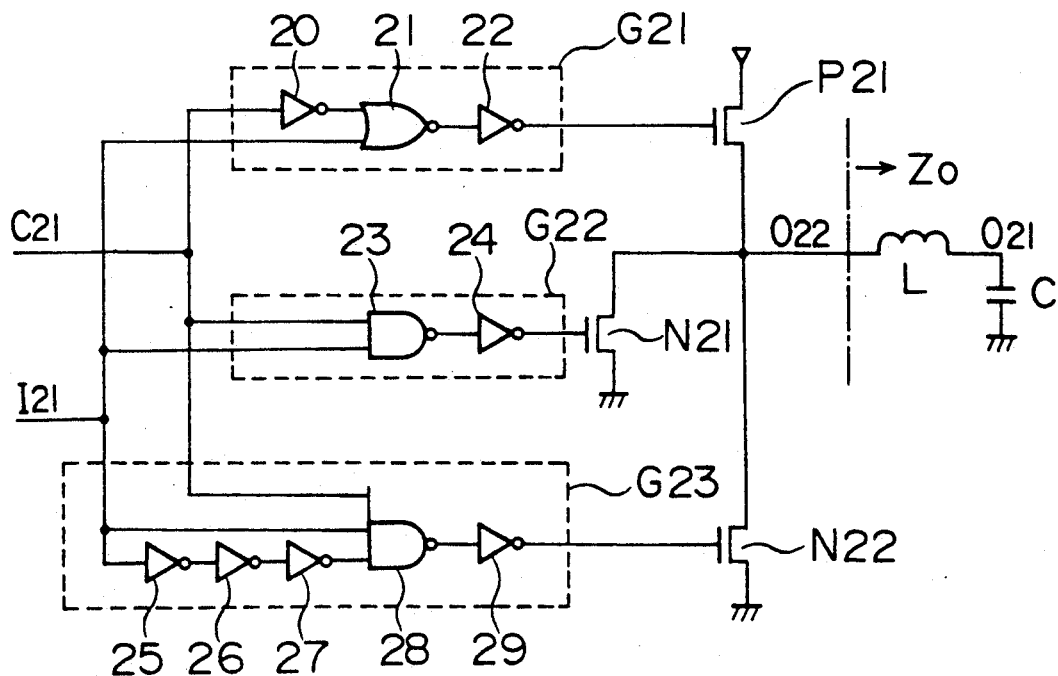
FIG. 6 is a circuit diagram showing a second embodiment of an output buffer of the present invention.

Referring now to FIG. 6, there is shown a circuit diagram of a second embodiment of the present invention. The second embodiment is substantially identical with the first embodiment in basic structure except that a drive circuit G21 for driving a P channel MOS transistor P21 comprises a NOR gate 21, inverters 20 and 22, and a drive circuit G22 for driving an N channel MOS transistor comprises a NAND gate 23 and an inverter 24. A control signal C21 is given to the drive circuits.

An auxiliary drive circuit G23 for driving an N channel MOS transistor N22 comprises a three-input NAND gate 28, and inverters 25 to 27 and 29. The control signal C21 is given to the NAND gate 28.

This embodiment operates similarly to the first embodiment if the control signal 21 is at the $V_{DD}$ level. If the control signal C21 is at the GND level, all the MOS transistors P21, N21 and N22 are turned off.

As mentioned above, the impedance of the output transistor is matched with that of the signal transmission line when the level of the potential rises on the signal output terminal in accordance with the present invention. When the potential falls down, the drive circuit drives the signal transmission line at a half of the impedance of the signal transmission line. After the potential has fallen, the impedance of the drive circuit becomes equal to that of the signal transmission line. Therefore, an overshoot and undershoot on the output point can be reduced so that high speed operation can be provided.

What is claimed is:

1. An output buffer of a semiconductor integrated circuit, comprising an input signal terminal, a first MOS transistor having a gate and connected between a first power source and an output terminal, a second MOS transistor having a gate and connected between a second power source and the output terminal, the first and second MOSs transistors being complementarily brought into a conductive state depending upon the level of an input signal given to the gates thereof for driving an output load including a signal transmission line connected to the output terminal, each of said first and second MOS transistors having an output resistance equal to the characteristic impedance of the signal transmission line, and an auxiliary control unit including a third MOS transistor having an output resistance equal to the characteristic impedance of the signal transmission line and connected in parallel with said second MOS transistor between the second power source and the output terminal, and a means for bringing said third MOS transistor into a conductive state only when the input signal rises.

2. An output buffer of a semiconductor integrated circuit according to claim 1, wherein said first MOS transistor is a P channel MOS transistor, said second MOS transistor is a N channel MOS transistor and said third MOSs transistor is a N channel MOS transistor.

3. An output buffer of a semiconductor integrated circuit according to claim 1, wherein said means comprises a circuit of series-connected inverters for inverting the input signal, a NAND gate connected with the input signal terminal through said circuit of series-connected inverters, and an inverter connected with an output of said NAND gate and the gate of said second MOS transistor.

4. An output buffer of a semiconductor integrated circuit according to claim 1, wherein said means comprises a circuit of series-connected inverters, a three-input NAND gate having a first input connected with a control signal terminal, a second input connected with the input signal terminal and a third input connected with an output of said circuit of series-connected inverters, an input of which is connected with the input signal terminal, and an inverter connected with an output of said three-input NAND gate and the gate of said second channel MOS transistor.

5. An output buffer of a semiconductor integrated circuit, comprising an input signal terminal, a first P channel MOS transistor having a gate and connected between a first power source and an output terminal, a first N channel MOS transistor having a gate and connected between a second power source and the output terminal, the first P and N channel MOS transistors being complementarily brought into a conductive state depending upon the level of an input signal given to the gates thereof for driving an output load including a signal transmission line connected with the output terminal, each of said first P and N channel MOS transistors having an output resistance equal to the characteristic impedance of the signal transmission line, and an auxiliary control unit including a second N channel MOS transistor having an output resistance equal to the characteristic impedance of the signal transmission line and connected in parallel with said first N channel MOS transistor between the second power source and the output terminal, and a drive circuit connected with the gate of the second N channel MOSs transistor for determining a conduction period of time of the second N channel MOS transistor.

6. An output buffer of a semiconductor integrated circuit according to claim 5, wherein said drive circuit comprises a circuit of series-connected inverters for inverting the input signal, a NAND gate connected with the input signal terminal through said circuit of series-connected inverters, and an inverter connected with an output of said NAND gate and the gate of said first N channel MOS transistor.

7. An output buffer of a semiconductor integrated circuit according to claim 5, wherein said drive circuit comprises a circuit of series-connected inverters, a three-input NAND gate having a first input connected with a control signal terminal, a second input connected with the input signal terminal and a third input connected with an output of said circuit of series-connected inverters, an input of which is connected with the input signal terminal, and an inverter connected with an output of said three-input NAND gate and the gate of said first N channel MOS transistor.

* * * * *